United States Patent
Sagawa et al.

(10) Patent No.: US 8,299,186 B2
(45) Date of Patent: Oct. 30, 2012

(54) CURABLE ORGANOPOLYSILOXANE COMPOSITION AND SEMICONDUCTOR DEVICE

(75) Inventors: Takashi Sagawa, Ichihara (JP); Masayoshi Terada, Ichihara (JP); Makoto Yoshitake, Funabashi (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 7 days.

(21) Appl. No.: 12/997,162

(22) PCT Filed: Jun. 11, 2009

(86) PCT No.: PCT/JP2009/061137
§ 371 (c)(1),
(2), (4) Date: Jan. 26, 2011

(87) PCT Pub. No.: WO2009/154260
PCT Pub. Date: Dec. 23, 2009

(65) Prior Publication Data
US 2011/0160410 A1    Jun. 30, 2011

(30) Foreign Application Priority Data
Jun. 18, 2008   (JP) .................................. 2008-159722

(51) Int. Cl.
C08G 77/38    (2006.01)
C08G 77/34    (2006.01)
H01L 33/00    (2010.01)

(52) U.S. Cl. ........................... 525/478; 528/32; 257/100
(58) Field of Classification Search .................. None
See application file for complete search history.

(56) References Cited

U.S. PATENT DOCUMENTS

| 4,082,726 | A | * | 4/1978 | Mine et al. ..................... 528/31 |
| 4,122,127 | A | * | 10/1978 | Mikami et al. ................. 525/477 |
| 4,157,357 | A | * | 6/1979 | Mine et al. ..................... 528/31 |
| 6,124,407 | A | * | 9/2000 | Lee et al. ....................... 525/478 |
| 6,235,862 | B1 | * | 5/2001 | Isshiki et al. .................... 528/15 |
| 6,761,947 | B2 | * | 7/2004 | Yamakawa et al. ............ 428/40.1 |
| 7,282,270 | B2 | * | 10/2007 | Morita et al. ................... 428/447 |
| 7,527,871 | B2 | * | 5/2009 | Morita et al. ................... 428/447 |
| 7,582,697 | B2 | * | 9/2009 | Hirai et al. ..................... 524/588 |
| 7,615,387 | B2 | * | 11/2009 | Miyoshi ............................ 438/22 |
| 7,651,887 | B2 | * | 1/2010 | Morita et al. ................... 438/106 |
| 2002/0161140 | A1 | | 10/2002 | Yoneda et al. |
| 2007/0134425 | A1 | * | 6/2007 | Morita et al. ................... 427/387 |
| 2009/0294796 | A1 | * | 12/2009 | Morita et al. ................... 257/100 |

FOREIGN PATENT DOCUMENTS

| JP | 11001619 A | 1/1999 |
| JP | 2000198930 A | 7/2000 |
| JP | 2005076003 A | 3/2005 |
| WO | WO 2007132910 A1 | 11/2007 |
| WO | WO 2007148812 A1 | 12/2007 |
| WO | WO 2009154261 A1 | 6/2009 |

OTHER PUBLICATIONS

English language translation and abstract for JP 11001619 extracted from the PAJ database Jun. 21, 2011, 26 pages.
English language translation and abstract for JP 2000198930 extracted from the PAJ database Jun. 21, 2011, 36 pages.
English language translation and abstract for JP 2005076003 extracted from the PAJ database Jun. 21, 2011, 21 pages.
PCT International Search Report for Application No. PCT/JP2009/061137 dated Jun. 11, 2009, 3 pages.
PCT International Search Report for Application No. PCT/JP2009/061138 dated Sep. 16, 2009, 3 pages.

* cited by examiner

*Primary Examiner* — Robert S Loewe
(74) *Attorney, Agent, or Firm* — Howard & Howard Attorneys PLLC

(57) ABSTRACT

A curable organopolysiloxane composition comprising: (A) an organopolysiloxane that contains in one molecule at least two alkenyl groups and at least 30 mole % of all silicon-bonded monovalent hydrocarbon groups in the form of aryl groups: (B) an organopolysiloxane that contains in one molecule at least two silicon-bonded hydrogen atoms and at least 15 mole % of all silicon-bonded organic groups in the form of aryl groups; (C) a branched-chain organopolysiloxane that contains alkenyl, aryl, and epoxy-containing organic groups; and (D) a hydrosilylation catalyst. The composition is capable of forming a cured body that has a high index of refraction and strong adhesion to substrates.

15 Claims, 1 Drawing Sheet

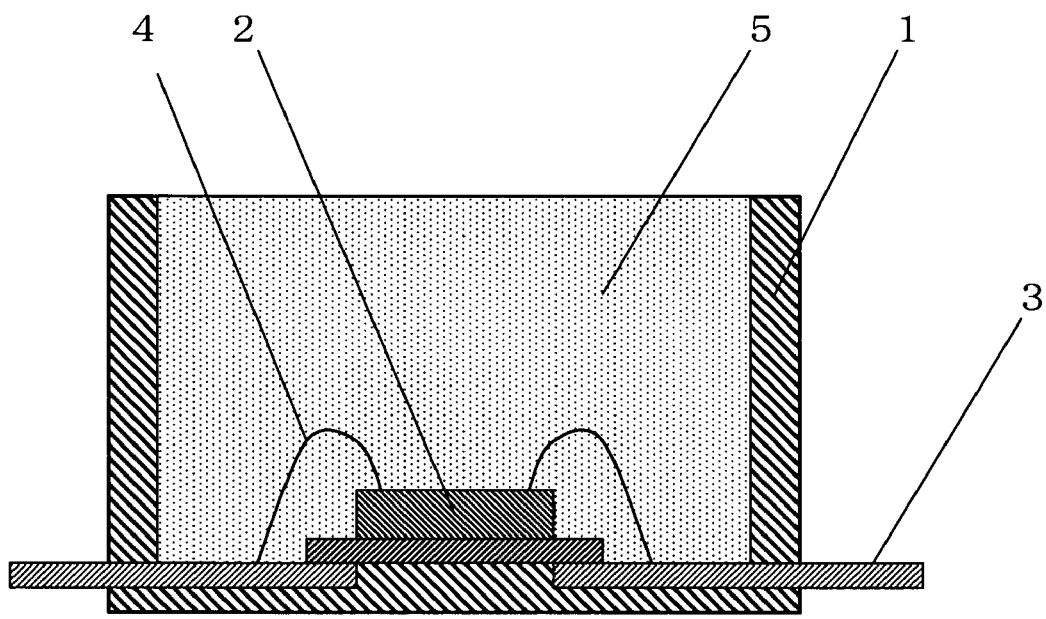

CURABLE ORGANOPOLYSILOXANE COMPOSITION AND SEMICONDUCTOR DEVICE

RELATED APPLICATIONS

This application claims priority to and all the advantages of International Patent Application No. PCT/JP2009/061137, filed on Jun. 11, 2009, which claims priority to Japanese Patent Application No. JP2008-159722, filed on Jun. 18, 2008.

TECHNICAL FIELD

The present invention relates to a curable organopolysiloxane composition and to a semiconductor device that employs this composition.

BACKGROUND ART

Curable organopolysiloxane compositions curable by a hydrosilylation reaction are used as protective or coating agents in the manufacture of semiconductor parts of optical semiconductor devices, such as photo-couplers, light-emitting diodes, solid state imaging elements, etc. Since the light received by the optical elements or emitted from these elements passes through the layers of the aforementioned protective or coating agents, it is required that they should neither absorb nor dissipate the light.

The curable organopolysiloxane composition that after curing by a hydrosilylation reaction forms a cured product having high transmittance and index of refraction can be exemplified, e.g., by a curable organopolysiloxane composition comprising: an organopolysiloxane that contains in one molecule at least two alkenyl groups and at least 20 mole % of all silicon-bonded organic groups in the form of aryl groups; an organopolysiloxane that contains silicon-bonded hydrogen atoms; an organopolysiloxane that contains in one molecule at least 5 mole % of all silicon-bonded organic groups in the form of alkenyl groups, at least 5 mole % of all silicon-bonded organic groups in the form of aryl groups, at least 5 mole % of all silicon-bonded organic groups in the form of alkoxy groups, and at least 5 mole % of all silicon-bonded organic groups in the form of epoxy organic groups; and a hydrosilylation catalyst (see Japanese Unexamined Patent Application Publication (hereinafter referred to as "Kokai") 2007-327019). Another example is a curable organopolysiloxane composition comprising: an organopolysiloxane that contains in one molecule at least 0.5 mole % of all silicon-bonded organic groups in the form of alkenyl groups and at least 25 mole % of all silicon-bonded organic groups in the form of aryl groups; an organopolysiloxane that contains in one molecule on average at least two silicon-bonded aryl groups and on average at least two silicon-bonded hydrogen atoms, and a hydrosilylation catalyst (see Kokai 2008-1828).

However, the above-mentioned curable organopolysiloxane compositions produce cured products which have low optical transmittance and in addition to this can be easily peeled from substrates since they have poor adherence to the substrate surfaces.

It is an object of the present invention to provide a curable organopolysiloxane composition that produces a cured body having a high index of refraction, high optical transmittance and good adherence to substrates. The invention also provides a semiconductor device that has semiconductor parts of excellent reliability due to coating thereof with a cured body of the aforementioned composition.

DISCLOSURE OF INVENTION

The curable organopolysiloxane composition of the invention comprises:
(A) an organopolysiloxane of the following average structural formula:

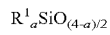

$$R^1_a SiO_{(4-a)/2}$$

(wherein $R^1$ designates unsubstituted or halogen-substituted monovalent hydrocarbon groups; however, in one molecule at least two groups designated by $R^1$ are alkenyl groups and at least 30 mole % of all groups designated by $R^1$ are aryl groups; and "a" is a number ranging from 0.6 to 2.1);
(B) an organopolysiloxane that contains in one molecule at least two silicon-bonded hydrogen atoms and at least 15 mole % of all silicon-bonded organic groups in the form of aryl groups;
(C) a branched-chain organopolysiloxane of the following average unit formula:

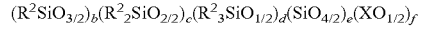

$$(R^2SiO_{3/2})_b(R^2_2SiO_{2/2})_c(R^2_3SiO_{1/2})_d(SiO_{4/2})_e(XO_{1/2})_f$$

{wherein each $R^2$ independently designates an alkyl group, alkenyl group, aryl group, or an epoxy-containing organic group; however, in one molecule at least 5 mole % of all groups designated by $R^2$ are alkenyl groups, at least 15 mole % of all groups designated by $R^2$ are aryl groups, and at least 10 mole % of all groups designated by $R^2$ are epoxy-containing organic groups; X designates a hydrogen atom or an alkyl group; and "b" is a positive number, "c" is 0 or a positive number, "d" is 0 or a positive number, "e" is 0 or a positive number, "f" is 0 or a positive number, "c/b" is a number ranging from 0 to 10, "d/b" is a number ranging from 0 to 5, "e/(b+c+d+e)" is a number ranging from 0 to 0.3, and "f/(b+c+d+e) is a number ranging from 0 to 0.02}; and
(D) a hydrosilylation catalyst;
wherein component (B) being used in such an amount that a mole ratio of the silicon-bonded hydrogen atoms contained in component (B) to the alkenyl groups contained in components (A) and (C) is in the range of 0.1 to 5;
component (C) being contained in an amount of 0.1 to 20 parts by mass per 100 parts by mass of the sum of components (A) and (B); and
component (D) being contained in an amount sufficient to accelerate curing of the composition.

In the composition of the invention, component (A) is a linear-chain organopolysiloxane of the following general formula:

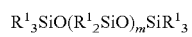

$$R^1_3SiO(R^1_2SiO)_m SiR^1_3$$

(wherein $R^1$ independently designates an unsubstituted or halogen-substituted monovalent hydrocarbon group; however, in one molecule at least two groups designated by $R^1$ are alkenyl groups and at least 30 mole % of all groups designated by $R^1$ are aryl groups; and "m" is an integer ranging from 5 to 1,000); and/or a branched-chain organopolysiloxane of the following average unit formula:

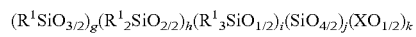

$$(R^1SiO_{3/2})_g(R^1_2SiO_{2/2})_h(R^1_3SiO_{1/2})_i(SiO_{4/2})_j(XO_{1/2})_k$$

{wherein $R^1$ is the same as defined above; however, in one molecule at least two groups designated by $R^1$ are alkenyl groups and at least 30 mole % of all groups designated by $R^1$ are aryl groups; and "g" is a positive number, "h" is 0 or a positive number, "i" is 0 or a positive number, "j" is 0 or a positive number, "k" is 0 or a positive number; "h/g" is a number ranging from 0 to 10, "i/g" is a number ranging from 0 to 5, "j/(g+h+i+j) is a number ranging from 0 to 0.3, and "k/(g+h+i+j) is a number ranging from 0 to 0.4}.

In the aforementioned curable organopolysiloxane composition, component (B) is a linear-chain organopolysiloxane represented by the following general formula:

$$R^3{}_3SiO(R^3{}_2SiO)_nSiR^3{}_3$$

(wherein $R^3$ independently designates a hydrogen atom, or an unsubstituted or halogen-substituted monovalent hydrocarbon group; however, in one molecule at least two groups designated by $R^3$ are hydrogen atoms and at least 15 mole % of all groups designated by $R^3$ are aryl groups; and "n" is an integer ranging from 5 to 1,000); and/or a branched-chain organopolysiloxane of the following average unit formula:

$$(R^3SiO_{3/2})_p(R^3{}_2SiO_{2/2})_q(R^3{}_3SiO_{1/2})_r(SiO_{4/2})_s(XO_{1/2})_t$$

{wherein $R^3$ is the same as defined above; however, in one molecule at least two groups designated by $R^3$ are hydrogen atoms and at least 15 mole % of all groups designated by $R^3$ are aryl groups; and "p" is a positive number, "q" is 0 or a positive number, "r" is 0 or a positive number, "s" is 0 or a positive number, "t" is 0 or a positive number; "q/p" is a number ranging from 0 to 10, "r/p" is a number ranging from 0 to 5, "s/(p+q+r+s)" is a number ranging from 0 to 0.3, and "t/(p+q+r+s)" is a number ranging from 0 to 0.4}.

The mass-average molecular weight of component (C) may be at least 2,000.

In the above-mentioned curable organopolysiloxane composition, the index of refraction (at 25° C.) in a visible light (589 nm) may be equal to or greater than 1.5. Furthermore, a cured product obtained by curing the composition may have transmittance (at 25° C.) that is equal to or greater than 80%.

A semiconductor device of the invention contains a semiconductor part that comprises a cured product of the above-mentioned curable organopolysiloxane composition. The semiconductor part may comprise a light-emitting element.

Effects of Invention

The curable organopolysiloxane composition of the invention produces a cured body having a high index of refraction, high optical transmittance, and good adherence to substrates. The semiconductor device of the invention has semiconductor parts of excellent reliability due to coating thereof with a cured body of the aforementioned composition.

BRIEF DESCRIPTION OF THE DRAWINGS

FIG. 1 is a cross-sectional view of a LED made in accordance with one embodiment of the semiconductor device of the invention.

REFERENCE NUMERALS USED IN THE DESCRIPTION

| | |
|---|---|
| 1 | polyphthalamide (PPA) resin case |
| 2 | LED chip |
| 3 | inner lead |
| 4 | bonding wires |
| 5 | cured product of curable organopolysiloxane composition |

DETAILED DESCRIPTION OF THE INVENTION

The following is a more detailed description of the curable organopolysiloxane composition of the invention.

Component (A) is one of the main components of the composition. This component is represented by the following average structural formula:

$$R^1{}_aSiO_{(4-a)/2}$$

In the above formula, $R^1$ designates unsubstituted or halogen-substituted monovalent hydrocarbon groups, which can be exemplified by a methyl, ethyl, propyl, butyl, pentyl, hexyl, heptyl, or a similar alkyl group; a vinyl, allyl, butenyl, pentenyl, hexenyl, or a similar alkenyl group; a phenyl, tolyl, xylyl, naphthyl, or a similar aryl group; a benzyl, phenethyl, or a similar aralkyl group; and 3-chloropropyl, 3,3,3-trifluoropropyl, or a similar halogen-substituted alkyl group. However, in one molecule at least two groups designated by $R^1$ are alkenyl groups. Most preferable of these alkenyl groups are vinyl groups. Furthermore, in order to reduce damping of light that may be caused by refraction, reflection, scattering, etc., when the light passes through the cured product, it is recommended that in one molecule at least 30 mole %, preferably at least 40 mole % of the groups represented by $R^1$ be aryl group, in particular, phenyl groups. In the above formula, "a" is a number ranging from 0.6 to 2.1. Component (A) may have a linear, branched, or a cyclic molecular structure. Molecular structure may be of one type or a combination of two or more types.

Component (A) may also comprise a linear-chain organopolysiloxane of the following general formula:

$$R^1{}_3SiO(R^1{}_2SiO)_mSiR^1{}_3$$

and/or a branched-chain organopolysiloxane of the following average unit formula:

$$(R^1SiO_{3/2})_g(R^1{}_2SiO_{2/2})_h(R^1{}_3SiO_{1/2})_i(SiO_{4/2})_j(XO_{1/2})_k$$

In the above formulae, $R^1$ independently designates unsubstituted or halogen-substituted monovalent hydrocarbon groups, which are the same as defined above. However, in one molecule at least two groups designated by $R^1$ are alkenyl groups. Most preferable of these alkenyl groups are vinyl groups. In order to reduce damping of light that may be caused by refraction, reflection, scattering, etc., when the light passes through the cured product, it is recommended that in one molecule at least 30 mole %, preferably at least 40 mole % of groups be represented by $R^1$ be aryl group, in particular, phenyl groups. In the above formula, "m" is a number ranging from 5 to 1,000; "g" is a positive number, "h" is 0 or a positive number, "i" is 0 or a positive number, "j" is 0 or a positive number, "k" is 0 or a positive number; "h/g" is a number ranging from 0 to 10, "i/g" is a number ranging from 0 to 5, "j/(g+h+i+j)" is a number ranging from 0 to 0.3, and "k/(g+h+i+j)" is a number ranging from 0 to 0.4.

Component (B), which is a cross-linking agent of the composition, comprises an organopolysiloxane that contains in one molecule at least two silicon-bonded hydrogen atoms. The silicon-bonded organic groups contained in component (B) are represented by methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; and 3-chloropropyl, 3,3,3-trifluoropropyl, or similar halogenated alkyl groups. In order to reduce damping of light that may be caused by refraction, reflection, scattering, etc., when the light passes through the cured product, it is recommended that in one molecule of this component at least 15 mole %, preferably at least 25 mole % of all silicon-bonded organic groups be aryl group. Component (B) may have a linear, branched, or cyclic molecular structure. Molecular structure may be of one type or a combination of two or more types.

Component (B) may also comprise a linear-chain organopolysiloxane represented by the following general formula:

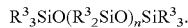

and/or a branched-chain organopolysiloxane of the following average unit formula:

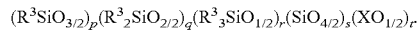

In these formulae, $R^3$ independently designates a hydrogen atoms, or unsubstituted or halogen-substituted monovalent hydrocarbon groups. The monovalent hydrocarbon groups designated by $R^3$ may be exemplified by methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; and 3-chloropropyl, 3,3,3-trifluoropropyl, or similar halogenated alkyl groups. However, in one molecule, at least two groups designated by $R^3$ should be formed by hydrogen atoms. Furthermore, in order to reduce damping of light that may be caused by refraction, reflection, scattering, etc., when the light passes through the cured product, it is recommended that in one molecule of this component at least 15 mole %, preferably at least 40 mole % of groups represented by $R^3$ be aryl group. The preferable aryl groups are phenyl groups. In the formulae, "n" is an integer ranging from 5 to 1,000, "p" is a positive number, "q" is 0 or a positive number, "r" is 0 or a positive number, "s" is 0 or a positive number, "t" is 0 or a positive number, "q/p" ranges from 0 to 10, "r/p" ranged from 0 to 5, "s/(p+q+r+s)" ranges from 0 to 3, and "t/(p+q+r+s)" ranges from 0 to 0.4.

Component (C) is used for improving adherence of the composition to substrates. This component is a branched-chain organopolysiloxane of the following average unit formula:

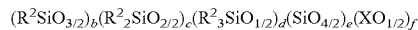

In this formula, $R^2$ independently designates an alkyl group, alkenyl group, aryl group, or an epoxy-containing organic group. As the alkyl group, $R^2$ may be specifically exemplified by a methyl, ethyl, propyl, butyl, pentyl, hexyl, or heptyl group, of which methyl group is preferable. As alkenyl group, $R^2$ may be exemplified by vinyl, allyl, butenyl, pentenyl, or a hexenyl group, of which the vinyl group is preferable. The aryl groups represented by $R^2$ may be specifically exemplified by phenyl, tolyl, xylyl, and naphthyl groups, of which phenyl groups are preferable. The epoxy-containing organic groups designated by $R^2$ may be specifically exemplified by 3-glycidoxypropyl, 3,4-epoxycyclohexylethyl, 3,4-epoxybutyl, or 5,6-epoxyhexyl group, of which 3-glycidoxypropyl group is preferable. However, in one molecule, at least 5 mole %, preferably at least 8 mole % of all groups designated by $R^2$ are alkenyl groups. Furthermore, in one molecule, at least 15 mole %, preferably 25 mole % of all groups designated by $R^2$ are aryl groups. Moreover, in one molecule, at least 10 mole %, preferably at least 20 mole %, of all groups designated by $R^2$ are epoxy-containing organic groups. In the above formula, X designates a hydrogen atom or an alkyl group. The alkyl groups designated by X may be methyl, ethyl, propyl, butyl, pentyl, hexyl, or heptyl groups, of which methyl groups are preferable. In the above formula, "b" is a positive number, "c" is 0 or a positive number, "d" is 0 or a positive number, "e" is 0 or a positive number, and "f" is 0 or a positive number; "c/b" is a number ranging from 0 to 10; "d/b" is a number ranging from 0 to 5; "e/(b+c+d+e)" is a number ranging from 0 to 0.3; and "f/(b+c+d+e)" is a number raging from 0 to 0.02. Component (C) should have a mass-average molecular weight not lower than 2,000.

Component (D) is a hydrosilylation catalyst, which is used for accelerating the hydrosilylation reaction between silicon-bonded hydrogen atoms of component (B) and alkenyl groups contained in components (A) and (C). Component (D) may comprise a platinum-based catalyst, rhodium-based catalyst, or a palladium-based catalyst. The platinum-based catalyst is preferable since it significantly accelerates curing of the composition. The platinum-based catalyst can be exemplified by a platinum-alkenylsiloxane complex, a platinum-olefin complex, or a platinum-carbonyl complex, of which the platinum-alkenylsiloxane complex is preferable. Such an alkenylsiloxane can be exemplified by the 1,3-divinyl-1,1,3,3-tetramethyl disiloxane, 1,3,5,7-tetramethyl-1,3,5,7-tetravinyl cyclotetrasiloxane, substituted alkenylsiloxane which are the aforementioned alkenylsiloxanes having a part of the methyl groups substituted with ethyl, phenyl groups, or substituted alkenylsiloxane which are the aforementioned alkenylsiloxanes having a part of the vinyl groups substituted with aryl, hexenyl, or similar groups. From the viewpoint of better stability of the platinum-alkenylsiloxane complexes, the use of the 1,3-divinyl-1,1,3,3-tetramethyl disiloxane is preferable. For further improvement of stability, the aforementioned alkenylsiloxane complexes can be combined with 1,3-divinyl-1,1,3,3-tetramethyl disiloxane, 1,3-diallyl-1,1,3,3-tetramethyl disiloxane, 1,3-divinyl-1,1,3,3-tetraphenyl disiloxane, 1,3,5,7-tetramethyl-1,3,5,7-tetravinyl cyclotetrasiloxane, or similar alkenylsiloxanes, dimethylsiloxane oligomers, or other organosiloxane oligomers. Most preferable are alkenylsiloxanes.

The composition comprises the aforementioned components (A) through (D), which are used in the amounts described below.

Component (B) is added in such an amount that the mole ratio of hydrogen atoms contained in this component to alkenyl groups of components (A) and (C) is in the range of 0.1 to 5, preferably in the range of 0.5 to 2. If component (B) is added in an amount less than the recommended lower limit, the obtained composition will not be cured to a sufficient degree. If, on the other hands, the added amount of component (B) exceeds the recommended upper limit, this will impair heat resistance of a cured product of the composition.

Component (C) is added in an amount of 0.1 to 20 parts by mass, preferably 0.1 to 10 parts by mass, and most preferably 0.2 to 10 parts by mass per 100 parts by mass of the sum of components (A) and (B). If component (C) is added in an amount less than the recommended lower limit, this will impair adherence of the obtained cured products to substrates. If, on the other hands, the added amount of component (C) exceeds the recommended upper limit, this will cause coloring of the cured product.

Component (D) is added in an amount sufficient for curing the composition. More specifically, in terms of mass units, this component is added in an amount of 0.01 to 500 ppm, preferably 0.01 to 100 ppm, and most preferably, 0.01 to 50 ppm of the metal atoms of this component per mass of the composition. If the added amount of component (D) is below the recommended lower limit, the composition will not be cured to a sufficient degree. If, on the other hand, the added amount exceeds the recommended upper limit, this will lead to coloring of a cured product of the composition.

If necessary, the composition may incorporate arbitrary components, such as 2-methyl-3-butyn-2-ol, 3,5-dimethyl-1-hexyn-3-ol, 2-phenyl-3-butyn-2-ol, or similar alkyn alcohols; 3-methyl-3-penten-1-yne, 3,5-dimethyl-3-hexen-1-yne, or a similar enyne-based compound; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazole or similar reaction inhibitors. Although there are no special restrictions with regard to the amounts in which the aforementioned reaction inhibitors can be used, it is recommended to add the reaction inhibitors in an amount of 0.0001 to 5 parts by mass per 100 parts by mass of the sum of components (A) to (C).

Within the limits not contradictory to the object of the invention, the aforementioned arbitrary components may also include silica, glass, alumina, zinc oxide, or other inorganic fillers; a powdered polymethacrylate resin, or other fine organic resin powders; as well as heat-resistance agents, dyes, pigments, flame retardants, solvents, etc.

Although there are no restrictions with regard to a viscosity of the composition at 25° C., it is recommended that the viscosity of the composition be in the range of 100 to 1,000,000 mPa·s, preferably 500 to 50,000 mPa·s. If the composition viscosity is below the recommended lower limit, this will impair mechanical strength of a cured body of the composition, and, if, on the other hand, the viscosity exceeds the recommended upper limit, this will impair handleability and workability of the composition.

In a visible light (589 nm), the present composition has an index of refraction (at 25° C.) which is equal to or greater than 1.5. It is recommended that the transmittance (at 25° C.) of light through a cured product obtained by curing the composition be equal to or greater than 80%. If the index of refraction of the composition is below 1.5, and the light transmittance through the cured product is below 80%, it will be impossible to impart sufficient reliability to a semiconductor device having a semiconductor part coated with a cured body of the composition. The index of refraction can be measured, e.g., with the use of an Abbe refractometer. By changing the wavelength of the light source used in the Abbe refractometer, it is possible to measure the index of refraction at any wavelength. Furthermore, the index of refraction can be also determined with the use of a spectrophotometer by measuring a cured body of the composition having an optical path of 1.0 mm.

The composition of the invention is cured at room temperature or by heating. However, for acceleration of the curing process, heating is recommended. The heating temperature is in the range of 50 to 200° C. The composition of the invention may be used as an adhesive, potting agent, protective agent, coating agent, or underfiller agent for parts of electrical and electronic devices. In particular, since the composition has high light-transmittance, it is suitable for use as an adhesive, potting agent, protective agent, or underfiller agent for semiconductor parts of optical devices.

The semiconductor device of the invention will now be described in more details.

The device contains a semiconductor part coated with a cured body of the aforementioned curable organopolysiloxane composition. The aforementioned semiconductor part may comprise a diode, transistor, thyristor, solid-state imaging element, monolithic IC, or a semiconductor part of a hybrid IC. The semiconductor device itself may comprise a diode, light-emitting diode (LED), transistor, thyristor, photocoupler, CCD, monolithic IC, hybrid IC, LSI, or a VLSI. In particular, in view of high light transmittance, the device most suitable for realization of the invention is a light-emitting diode (LED).

FIG. 1 is a cross-sectional view of a single surface-mounted LED shown as an example of the device of the invention. The LED shown in FIG. 1 comprises a semiconductor (LED) chip 2 die-bonded to a frame, while the semiconductor (LED) chip 2 and a lead frame 3 are wire-bonded via bonding wires 4. The semiconductor (LED) chip 2 is coated with a cured body 5 of the curable organopolysiloxane composition of the invention.

A method of manufacturing the surface-mounted LED shown in FIG. 1 consists of die-bonding the semiconductor (LED) chip 2 to the frame, wire-bonding the semiconductor (LED) chip 2 and the lead frame 3 by means of the bonding wires 4, applying the curable organopolysiloxane composition of the invention onto the semiconductor (LED) chip 2, and then curing the composition by heating it to a temperature in the range of 50 to 200° C.

EXAMPLES

The curable organopolysiloxane composition and the semiconductor device of the invention will now be described in details by way of practical and comparative examples. All values in these examples were obtained at 25° C. In the formulae, Me, Ph, Vi, and Ep corresponds to methyl groups, phenyl groups, vinyl groups, and 3-glycidoxypropyl groups, respectively.

Characteristics of the curable organopolysiloxane composition and a cured product thereof were measured by the methods described below.

[Index of Refraction of the Curable Organopolysiloxane Composition]

The index of refraction of the curable organopolysiloxane composition measured at 25° C. by means of an Abbe refractometer. The source of light utilized visible light of 589 nm.

[Light Transmittance Through the Cured Product]

The curable organopolysiloxane composition was sandwiched between two glass plates and cured for 1 hour at 150° C., and then light transmittance through the obtained cured body (optical path 0.2 mm) was determined by an automatic spectrophotometer at 25° C. capable of measuring at an arbitrary wavelength of the visible light in the wavelength range of 400 nm to 700 nm. Transmittance of light was measured through the package and through the glass plate alone, and the difference between the first and second measurements corresponded to transmittance through the cured body of the composition. Light transmittances at the wavelength of 450 nm are shown in Table 1.

[Hardness of the Cured Product]

The curable organopolysiloxane composition was formed into a sheet-like cured product by press-forming for 1 hour at 150° C. Hardness of the obtained sheet-like cured product was measured in accordance with JIS K 6253 by means of a type A or type D durometer.

[Strength of Adhesion to a Polyphthalamide (PPA) Resin Plate]

Two polytetrafluoroethylene-resin spacers (width: 10 mm; length: 20 mm; thickness: 1 mm) were sandwiched between two polyphthalamide (PPA) resin plates (width: 25 mm; length: 50 mm; thickness: 1 mm), the remaining space between the plates was filled with the curable organopolysiloxane composition, the package was fixed by means of clips and placed into a hot-air-circulation oven for curing the composition during 1 hour at 150° C. The cured product was cooled to room temperature, the clips and spacers were removed, and the aforementioned polyphthalamide resin plates were pulled in opposite horizontal directions on a tensile tester for measuring stress at rupture.

[Strength of Adhesion to an Aluminum Plate]

Two polytetrafluoroethylene-resin spacers (width: 10 mm; length: 20 mm; thickness: 1 mm) were sandwiched between two aluminum plates (width: 25 mm; length: 75 mm; thickness: 1 mm), the remaining space between the plates was filled with the curable organopolysiloxane composition, the package was fixed by means of clips and placed into a hot-air-circulation oven for curing the composition during 1 hour at 150° C. The cured product was cooled to room temperature, the clips and spacers were removed, and the aforementioned aluminum plates were pulled in opposite horizontal directions on a tensile tester for measuring stress at rupture.

[Manufacturing of Surface-Mounted-Type Light Emitting Diode (LED)]

Following this, a surface-mounted-type light-emitting diode (LED) was manufactured with the curable organopolysiloxane composition.

Inner leads were placed on the bottoms of sixteen cylindrical polyphthalamide (PPA) resin cases (inner diameter: 2.0 mm; depth: 1.0 mm) and extended to the outside of the cases through their side walls. LED chips were placed over the inner leads on the central bottom parts of the cases, and the LED chips were electrically connected to the inner leads by bonding wires, whereby semi-products of the devices were obtained. By means of a dispenser, the interiors of the polyphthalamide resin cases were filled with preliminarily de-aerated curable organopolysiloxane compositions described in respective practical and comparative examples, and the compositions were cured in a heating oven for 30 min. at 100° C. and then for 1 hour at 150° C., whereby sixteen surface-mounted light-emitting diodes (LED's) of the type shown in FIG. 1 were produced.

The obtained surface-mounted light-emitting diodes were evaluated with regard to percentage of peeling of the cured body in the manner described below.

[Percentage of Peeling at the Initial Stage]

Conditions of peeling of the hot cured body of the composition from the inner walls of the polyphthalamide (PPA) case were observed under an optical microscope on all sixteen surface-mounted light-emitting diodes (LED's), and the percentage of peeled was determined as the ratio of the number of peeled samples to 16.

[Percentage of Peeling after Retention Under Conditions of Constant Temperature and Constant Humidity]

All sixteen surface-mounted light-emitting diodes (LED's) were held for 72 hours in air at a temperature of 30° C. and relative humidity of 70%, and after cooling to room temperature (25° C.), conditions of peeling of the cured body of the composition from the inner walls of the polyphthalamide (PPA) cases were observed under an optical microscope, and the percentage of peeling was determined as the ratio of the peeled samples to 16.

[Percentage of Peeling after 30 Sec. Retention at 280° C.]

All sixteen surface-mounted light-emitting diodes (LED's) were held for 30 sec. in an oven at 280° C. After cooling to room temperature (25° C.), conditions of peeling of the cured body of the composition from the inner walls of the polyphthalamide (PPA) cases were observed under an optical microscope, and the percentage of peeling was determined as the ratio of the peeled samples to 16.

[Percentage of Peeling after Cyclic Thermal Shock]

After holding for 30 sec. at 280° C., sixteen surface-mounted diodes (LED's) were retained for 30 min. at −40° C., then for 30 min. at +100° C., and the aforementioned "−40° C.↔+100° C." cycle was repeated four times. Following this, the LED's were cooled to room temperature (25° C.), conditions of peeling of the hot cured body from the inner walls of the polyphthalamide (PPA) case were observed under an optical microscope, and the percentage of peeling was determined as the ratio of the peeled samples to 16.

Practical Example 1

A curable organopolysiloxane composition having viscosity of 3,400 mPa·s was prepared by uniformly mixing the following components:

60 parts by mass of a methylphenylpolysiloxane capped at both molecular terminals with dimethylvinylsiloxy groups (viscosity=3,500 mPa·s; vinyl group content=1.5 mass %; content of phenyl groups in all silicon-bonded organic groups=49 mole %);

20 parts by mass of a branched-chain organopolysiloxane which is solid at 25° C. and is represented by the following average unit formula:

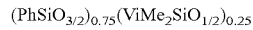

(content of vinyl groups=5.6 mass %; content of phenyl groups in all silicon-bonded organic groups=50 mole %);

10 parts by mass of a diphenylpolysiloxane represented by the following formula:

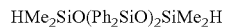

(viscosity=115 mPa·s; content of silicon-bonded hydrogen atoms=0.32 mass %; content of phenyl groups in all silicon-bonded organic groups=50 mole %);

10 parts by mass of a branched-chain organopolysiloxane represented by the following average unit formula:

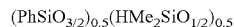

(viscosity=1,400 mPa·s; content of silicon-bonded hydrogen atoms=0.51 mass %; content of phenyl groups in all silicon-bonded organic groups=33 mole %);

4 parts by mass of a branched-chain organopolysiloxane represented by the following average unit formula:

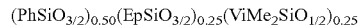

(viscosity=12,000 mPa·s; content of vinyl groups in all silicon-bonded organic groups=16.7 mole %; content of 3-glycidoxypropyl groups in all silicon-bonded organic groups=16.7 mole %; content of phenyl groups in all silicon-bonded organic groups=33.3 mole %; mass-average molecular weight=4,500)

a platinum-1,3-divinyl-1,1,3,3-tetramethyldisiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Practical Example 2

A curable organopolysiloxane composition having viscosity of 2,100 mPa·s was prepared by uniformly mixing the following components:

70 parts by mass of a branched-chain organopolysiloxane which was solid at 25° C. and is represented by the following average unit formula:

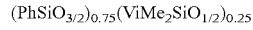

(content of vinyl groups=5.6 mass %; content of phenyl groups in all silicon-bonded organic groups=50 mole %);

30 parts by mass of a diphenylpolysiloxane represented by the following formula:

HMe$_2$SiO(Ph$_2$SiO)SiMe$_2$H (viscosity=115 mPa·s; content of silicon-bonded hydrogen atoms=0.60 mass %; content of phenyl groups in all silicon-bonded organic groups=33 mole %);

2 parts by mass of a branched-chain organopolysiloxane represented by the following average unit formula:

(PhSiO$_{3/2}$)$_{0.60}$(EpMeSiO$_{2/2}$)$_{0.20}$(ViMe$_2$SiO$_{1/2}$)$_{0.20}$ (viscosity=37,000 mPa·s; content of vinyl groups in all silicon-bonded organic groups=12.5 mole %; content of 3-glycidoxypropyl groups in all silicon-bonded organic groups=12.5 mole %; content of phenyl groups in all silicon-bonded organic groups=37.5 mole %; mass-average molecular weight=3,800);

a platinum-1,3-divinyl-1,1,3,3-tetramethyldisiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Practical Example 3

A curable organopolysiloxane composition having viscosity of 2,400 mPa·s was prepared by uniformly mixing the following components:

40 parts by mass of a methylphenylpolysiloxane capped at both molecular terminals with dimethylvinylsiloxy groups (viscosity=3,500 mPa·s; content of vinyl groups=1.5 mass %; content of phenyl groups in all silicon-bonded organic groups=49 mole %);

40 parts by mass of a branched-chain organopolysiloxane which is solid at 25° C. and is represented by the following average unit formula:

(PhSiO$_{3/2}$)$_{0.75}$(ViMe$_2$SiO$_{1/2}$)$_{0.25}$ (content of vinyl groups=5.6 mass %; content of phenyl groups in all silicon-bonded organic groups=50 mole %);

20 parts by mass of a diphenylpolysiloxane represented by the following formula:

HMe$_2$SiO(Ph$_2$SiO)SiMe$_2$H (viscosity=5 mPa·s; content of silicon-bonded hydrogen atoms=0.60 mass %; content of phenyl groups in all silicon-bonded organic groups=33 mole %);

4 parts by mass of a branched-chain organopolysiloxane represented by the following average unit formula:

(EpSiO$_{3/2}$)$_{0.4}$(Ph$_2$SiO$_{2/2}$)$_{0.40}$(ViMeSiO$_{2/2}$)$_{0.20}$ (viscosity=13,000 mPa·s; content of vinyl groups in all silicon-bonded organic groups=12.5 mole %; content of 3-glycidoxypropyl groups in all silicon-bonded organic groups=25 mole %; content of phenyl groups in all silicon-bonded organic groups=50 mole %; mass-average molecular weight=3,200);

a platinum-1,3-divinyl-1,1,3,3-tetramethyldisiloxane complex (used in the composition in such an amount that in terms of mass units the content of the metallic platinum of the complex was 2.5 ppm); and 0.05 parts by mass of 2-phenyl-3-butyn-2-ol.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 1

A curable organopolysiloxane composition having viscosity of 3,200 mPa·s was obtained by the same method as in Practical Example 1, except that the same amount of a branched organopolysiloxane of the following formula:

(PhSiO$_{3/2}$)$_{0.50}$(EpSiO$_{3/2}$)$_{0.25}$(ViMe$_2$SiO$_{1/2}$)$_{0.25}$(MeO$_{1/2}$)$_{0.10}$ (viscosity=4,100 mPa·s; content of methoxy groups per all siloxane units=10 mole %; mass-average molecular weight=2,400) was used instead of the branched organopolysiloxane of the following average unit formula:

(PhSiO$_{3/2}$)$_{0.50}$(EpSiO$_{3/2}$)$_{0.25}$(ViMe$_2$SiO$_{1/2}$)$_{0.25}$, used in Practical Example 1.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 2

A curable organopolysiloxane having viscosity of 2,000 mPa·s was obtained by the same method as in Practical Example 2, except that the branched organopolysiloxane of the following average unit formula:

(PhSiO$_{3/2}$)$_{0.60}$(EpMeSiO$_{2/2}$)$_{0.20}$(ViMe$_2$SiO$_{1/2}$)$_{0.20}$ was not used.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

Comparative Example 3

A curable organopolysiloxane composition having viscosity of 2,400 mPa·s was obtained by the same method as in Practical Example 3, except that the same amount of a branched organopolysiloxane of the following formula:

(EpSiO$_{3/2}$)$_{0.4}$(Ph$_2$SiO$_{2/2}$)$_{0.40}$(Me$_2$SiO$_{2/2}$)$_{0.20}$ (viscosity=13,000 mPa·s; content of 3-glycidoxypropyl groups in all silicon-bonded organic groups=25 mole %; content of phenyl groups in all silicon-bonded organic groups=50 mole %; mass-average molecular weight=3,200) was used instead of the branched organopolysiloxane of the following average unit formula:

(EpSiO$_{3/2}$)$_{0.4}$(Ph$_2$SiO$_{2/2}$)$_{0.40}$(ViMeSiO$_{2/2}$)$_{0.20}$ used in Practical Example 3.

Characteristics of the obtained curable organopolysiloxane composition and of a cured body of the composition were measured. A surface-mounted light-emitting diode utilizing the obtained curable organopolysiloxane composition was manufactured and tested with regard to reliability. The results are shown in Table 1.

TABLE 1

| | Examples | | | | | |
|---|---|---|---|---|---|---|
| | Practical Examples | | | Comparative Examples | | |
| Characteristics | 1 | 2 | 3 | 1 | 2 | 3 |
| Index of refraction | 1.543 | 1.533 | 1.539 | 1.543 | 1.534 | 1.539 |
| Characteristics of Cured Product | | | | | | |
| Light transmittance (%) | 99.5 | 99.6 | 99.7 | 99.3 | 99.8 | 99.6 |
| Hardness     Type A | | 60 | 72 | | 58 | 70 |
|              Type D | 68 | | | 67 | | |
| Adhesive strength (MPa) | | | | | | |
| Polyphthalamide resin plate | 10 | 4 | 8 | 7 | 0 | 3 |
| Aluminum plate | 12 | 5 | 9 | 8 | 1 | 4 |
| Percentage of peeling (%) | | | | | | |
| Initial | 0 | 0 | 0 | 0 | 25 | 0 |
| After retention at constant temperature and humidity | 0 | 0 | 0 | 18.8 | 100 | 43.8 |
| After holding for 30 sec. at 280° C. | 0 | 0 | 0 | 25 | 100 | 68.8 |
| After thermal shock cycle | 1.3 | 0 | 0 | 56.3 | 100 | 100 |

INDUSTRIAL APPLICABILITY

The curable organopolysiloxane composition of the invention can be used as an adhesive, potting agent, protective agent, coating agent, or an underfill agent for parts of electrical and electronic devices. In particular, since the composition has high light-transmittance, it is suitable for use as an adhesive, potting agent, protective agent, or an underfiller agent for semiconductor parts of optical devices. The semiconductor device of the invention can be embodied into diodes, light-emitting diodes (LED's), transistors, thyristors, photocouplers, CCD, monolithic IC's, hybrid IC's, LSI's or VLSI's.

The invention claimed is:

1. A curable organopolysiloxane composition comprising:
(A) an organopolysiloxane of the following average structural formula:

$R^1_a SiO_{(4-a)/2}$ (wherein $R^1$ designates unsubstituted or halogen-substituted monovalent hydrocarbon groups; however, in one molecule at least two groups designated by $R^1$ are alkenyl groups and at least 30 mole % of all groups designated by $R^1$ are aryl groups; and "a" is a number ranging from 0.6 to 2.1);

(B) an organopolysiloxane that contains in one molecule at least two silicon-bonded hydrogen atoms and at least 15 mole % of all silicon-bonded organic groups in the form of aryl groups;

(C) a branched-chain organopolysiloxane of the following average unit formula:

$(R^2SiO_{3/2})_b(R^2_2SiO_{2/2})_c(R^2_3SiO_{1/2})_d(SiO_{4/2})_e(XO_{1/2})_f$

{wherein each $R^2$ independently designates an alkyl group, alkenyl group, aryl group, or an epoxy-containing organic group; however, in one molecule at least 5 mole % of all groups designated by $R^2$ are alkenyl groups, at least 15 mole % of all groups designated by $R^2$ are aryl groups, and at least 10 mole % of all groups designated by $R^2$ are epoxy-containing organic groups; X designates a hydrogen atom or an alkyl group; and "b" is a positive number, "c" is 0 or a positive number, "d" is 0 or a positive number, "e" is 0 or a positive number, "f" is 0 or a positive number, "c/b" is a number ranging from 0 to 10, "d/b" is a number ranging from 0 to 5, "e/(b+c+d+e)" is a number ranging from 0 to 0.3, and "f/(b+c+d+e)" is a number ranging from 0 to 0.02}; and
(D) a hydrosilylation catalyst;
wherein component (B) is used in such an amount that the mole ratio of the silicon-bonded hydrogen atoms contained in component (B) to the alkenyl groups contained in components (A) and (C) is in the range of 0.1 to 5;
component (C) is contained in an amount of 0.1 to 20 parts by mass per 100 parts by mass of the sum of components (A) and (B); and
component (D) is contained in an amount sufficient to accelerate curing of the composition.

2. The curable organopolysiloxane composition of claim 1, wherein component (A) is a linear-chain organopolysiloxane of the following general formula:

$R^1_3SiO(R^1_2SiO)_m SiR^1_3$ (wherein $R^1$ independently designates an unsubstituted or halogen-substituted monovalent hydrocarbon group; however, in one molecule at least two groups designated by $R^1$ are alkenyl groups and at least 30 mole % of all groups designated by $R^1$ are aryl groups; and "m" is an integer ranging from 5 to 1,000); and/or a branched-chain organopolysiloxane of the following average unit formula:

$(R^1SiO_{3/2})_g(R^1_2SiO_{2/2})_h(R^1_3SiO_{1/2})_i(SiO_{4/2})_j(XO_{1/2})_k$

{wherein $R^1$ is the same as defined above; however, in one molecule at least two groups designated by $R^1$ are alkenyl groups and at least 30 mole % of all groups designated by $R^1$ are aryl groups; and "g" is a positive number, "h" is 0 or a positive number, "i" is 0 or a positive number, "j" is 0 or a positive number, "k" is 0 or a positive number; "h/g" is a number ranging from 0 to 10, "i/g" is a number ranging from 0 to 5, "j/(g+h+i+j)" is a number ranging from 0 to 0.3, and "k/(g+h+i+j)" is a number ranging from 0 to 0.4}.

3. The curable organopolysiloxane composition of claim 1, wherein component (B) is a linear-chain organopolysiloxane represented by the following general formula:

$$R^3_3SiO(R^3_2SiO)_nSiR^3_3$$

(wherein $R^3$ independently designates hydrogen atoms, or unsubstituted or halogen-substituted monovalent hydrocarbon groups; however, in one molecule at least two groups designated by $R^3$ are hydrogen atoms and at least 15 mole % of all groups designated by $R^3$ are aryl groups; and "n" is an integer ranging from 5 to 1,000); and/or a branched-chain organopolysiloxane of the following average unit formula:

$$(R^3SiO_{3/2})_p(R^3_2SiO_{2/2})_q(R^3_3SiO_{1/2})_r(SiO_{4/2})_s(XO_{1/2})_t$$

{wherein $R^3$ is the same as defined above; however, in one molecule at least two groups designated by $R^3$ are hydrogen atoms and at least 15 mole % of all groups designated by $R^3$ are aryl groups; and "p" is a positive number, "q" is 0 or a positive number, "r" is 0 or a positive number, "s" is 0 or a positive number, "t" is 0 or a positive number; "q/p" is a number ranging from 0 to 10, "r/p" is a number ranging from 0 to 5, "s/(p+q+r+s)" is a number ranging from 0 to 0.3, and "t/(p+q+r+s)" is a number ranging from 0 to 0.4}.

4. The curable organopolysiloxane composition of claim 1, wherein the mass-average molecular weight of component (C) is at least 2,000.

5. The curable organopolysiloxane composition of claim 1, wherein the index of refraction (at 25° C.) in a visible light (589 nm) is equal to or greater than 1.5.

6. The curable organopolysiloxane composition of claim 1, wherein a cured product obtained by curing the composition has transmittance (at 25° C.) that is equal to or greater than 80%.

7. A semiconductor device that contains a semiconductor part comprising a cured product of the curable organopolysiloxane composition according to claim 1.

8. The semiconductor device of claim 7, wherein the semiconductor part is a light-emitting element.

9. The curable organopolysiloxane composition of claim 1, wherein, in one molecule of component (A);
the alkenyl groups designated by $R^1$ are vinyl groups, and the at least 30 mole % of all groups designated by $R^1$ which are aryl groups comprise at least 40 mole % phenyl groups.

10. The curable organopolysiloxane composition of claim 9, wherein component (B) contains, in one molecule, at least 25 mole % of all silicon-bonded organic groups in the form of aryl groups.

11. The curable organopolysiloxane composition of claim 1, wherein, in one molecule of component (A);
the alkenyl groups designated by $R^1$ are vinyl groups, and the at least 30 mole % of all groups designated by $R^1$ which are aryl groups comprise at least 40 mole % phenyl groups.

12. The curable organopolysiloxane composition of claim 1, wherein component (B) contains, in one molecule, at least 25 mole % of all silicon-bonded organic groups in the form of aryl groups.

13. The curable organopolysiloxane composition of claim 1, wherein, in one molecule of component (B);
the at least 15 mole % of groups designated by $R^3$ which are aryl groups comprise at least 40 mole % phenyl groups.

14. The curable organopolysiloxane composition of claim 1, wherein, in component (C), each $R^2$ independently designates a methyl group, vinyl group, phenyl group, or 3-glycidoxypropyl group; however, in one molecule at least 8 mole % of all groups designated by $R^2$ are alkenyl groups, at least 25 mole % of all groups designated by $R^2$ are aryl groups, and at least 20 mole % of all groups designated by $R^2$ are epoxy-containing organic groups.

15. The curable organopolysiloxane composition of claim 1, wherein; component (B) is used in such an amount that the mole ratio of the silicon-bonded hydrogen atoms contained in component (B) to the alkenyl groups contained in components (A) and (C) is in the range of 0.5 to 2;
component (C) is contained in an amount of 0.1 to 10 parts by mass per 100 parts by mass of the sum of components (A) and (B); and
component (D) is contained in an amount sufficient to accelerate curing of the composition which is an amount of 0.01 to 500 ppm of the metal atoms of component (D) per mass of the composition.

* * * * *